United States Patent
Chen et al.

(10) Patent No.: US 7,479,833 B2
(45) Date of Patent: Jan. 20, 2009

(54) DYNAMIC BIASING AMPLIFIER APPARATUS, DYNAMIC BIASING APPARATUS AND METHOD

(75) Inventors: Wei-Zen Chen, Hsinchu (TW); Dar-Huei Liao, Nantou County (TW); Chih-Jen Yen, Hsinchu (TW)

(73) Assignee: Novatek Microelectronics Corp., Hsinchu (TW)

( * ) Notice: Subject to any disclaimer, the term of this patent is extended or adjusted under 35 U.S.C. 154(b) by 19 days.

(21) Appl. No.: 11/832,653

(22) Filed: Aug. 2, 2007

(65) Prior Publication Data
US 2008/0231372 A1  Sep. 25, 2008

(30) Foreign Application Priority Data
Mar. 22, 2007  (TW) .............................. 96109882 A

(51) Int. Cl.
H03F 3/04  (2006.01)
(52) U.S. Cl. .................... 330/296; 330/136; 330/127
(58) Field of Classification Search .............. 330/296, 330/136, 127
See application file for complete search history.

(56) References Cited

U.S. PATENT DOCUMENTS

| | | | |
|---|---|---|---|
| 6,081,558 A * | 6/2000 | North ........................ 375/316 |
| 6,559,722 B1 * | 5/2003 | Lopez et al. ................ 330/296 |
| 6,765,443 B2 * | 7/2004 | Pehike ........................ 330/296 |
| 6,861,896 B2 * | 3/2005 | Tsividis et al. .............. 327/552 |
| 7,071,778 B2 * | 7/2006 | Butler ........................ 330/253 |
| 7,352,247 B2 * | 4/2008 | Oh et al. ..................... 330/311 |

* cited by examiner

Primary Examiner—Patricia Nguyen
(74) Attorney, Agent, or Firm—Jianq Chyun IP Office

(57) ABSTRACT

A dynamic biasing amplifier apparatus, and dynamic biasing apparatus, and method are disclosed. The dynamic biasing amplifier apparatus includes a comparator unit, a dynamic bias generator unit, and an amplifier unit. The amplifier unit receives an input signal and output an output signal based on at least a bias voltage. The comparator unit compares the positive and negative input signals of the amplifier unit. The dynamic bias generator unit generates and adjusts the bias voltage in accordance with the comparing result of the comparator unit. Therefore, the dynamic bias generator unit controls the amplifier unit to operate in a low static current mode when the input signal is in steady state; and the dynamic bias generator unit controls the amplifier unit to operate in a high dynamic current mode when the input signal is in transition state.

13 Claims, 7 Drawing Sheets

DYNAMIC BIASING AMPLIFIER APPARATUS, DYNAMIC BIASING APPARATUS AND METHOD

CROSS-REFERENCE TO RELATED APPLICATION

This application claims the priority benefit of Taiwan application serial no. 96109882, filed Mar. 22, 2007. All disclosure of the Taiwan application is incorporated herein by reference.

BACKGROUND OF THE INVENTION

1. Field of the Invention

The present invention relates to an operational amplifier. More particularly, the present invention relates to a dynamic biasing amplifier, dynamic biasing apparatus and method.

2. Description of Related Art

FIG. 1 is a block diagram of a conventional amplifier. In a conventional amplifier, a current source 110 supplies a constant current $I_{BP}$ to a DC bias generator 120. The DC bias generator 120 then generates a DC bias voltage VB1-1~VB1-n to an operational amplifier 130 based on the constant current $I_{BP}$. The operational amplifier 130 performs signal amplification based on the bias point provided by the DC bias generator 120, so as to amplify the input signal Vi into an output signal Vo.

If the operational amplifier has a relatively large load capacitance (CL), the DC bias generator 120 requires a higher DC bias current $I_{BP}$, such that the operational amplifier 130 can achieve the required switching speed. It turns out that the conventional amplifier has a drawback of high power consumption in the steady state since the DC bias current $I_{BP}$ must be very large (to meet the requirements of the switching speed) in high operation or driving a heavy load. On the other hand, if the DC bias current $I_{BP}$ of the conventional amplifier is small in order to save power, the operation speed will become very low.

SUMMARY OF THE INVENTION

The present invention provides a dynamic biasing amplifier apparatus, dynamic biasing apparatus and method, such that an amplifier can operate in a low current mode in the steady state to reduce the power consumption. When the voltage level of the input and output signals are not equal (i.e., the input signal is in the transition state), the amplifier can operate in a high current mode, so as to reduce the settling time of the amplifier.

As embodied and broadly described herein, the present invention provides a dynamic biasing amplifier apparatus, which includes a comparator unit, a dynamic bias generator unit, and an amplifier unit. The amplifier unit receives an input signal and output an output signal based on bias voltage. The comparator unit compares the input and output signals of the amplifier unit. The dynamic bias generator unit is coupled between the comparator unit and the amplifier unit. The dynamic bias generator unit generates and adjusts the bias voltage in accordance with the comparing result of the comparator unit. Therefore, the dynamic bias generator unit controls the amplifier unit to operate in a low static current mode when the input signal is in steady state; and the dynamic bias generator unit controls the amplifier unit to operate in a high dynamic current mode when the input signal is in transition state.

The present invention provides a dynamic biasing apparatus for providing at least a bias voltage to an amplifier unit, so as to control the amplifier unit to amplify an input signal to output an output signal. The dynamic biasing apparatus includes a comparator unit and a dynamic bias generator unit. The comparator unit compares the input and output signals. The dynamic bias generator unit is coupled to the comparator unit, for generating and adjusting the bias voltage in accordance with the comparing result of the comparator unit. Therefore, the dynamic bias generator unit controls the amplifier unit to operate in a low static current mode when the input signal is in steady state; and the dynamic bias generator unit controls the amplifier unit to operate in a high dynamic current mode when the input signal is in transition state.

The present invention provides a dynamic biasing method of an amplifier apparatus. The amplifier apparatus receives an input signal and output an output signal based on at least a bias voltage. The dynamic biasing method includes providing an operating current. The input and output signals are compared to obtain a comparing result. If the comparing result shows that the voltage of the output signal is approximate to that of the input signal, the operating current is adjusted to a small current. If the comparing result shows that the voltage of the output signal is not close to that of the input signal, the operating current is adjusted to a large current. The bias voltage is adjusted according to the value of the operating current, so as to control the amplifier apparatus to operate in a low static current mode when the input signal is in steady state, and to control the amplifier apparatus to operate in a high dynamic current mode when the input signal is at transition state.

In the present invention, the bias point of the amplifier apparatus can be changed in accordance with the comparing result of the input and output signals. Therefore, the amplifier apparatus is controlled to operate in a low static current mode when the input signal is in steady state; and the amplifier apparatus is controlled to operate in a high dynamic current mode when the input signal is in transition state. Particularly, when the amplifier apparatus is used to drive a relatively large capacitor, the present invention can greatly enhances the slew rate of the amplifier without increasing the static power consumption.

In order to make the aforementioned and other objects, features and advantages of the present invention comprehensible, preferred embodiments accompanied with figures are described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
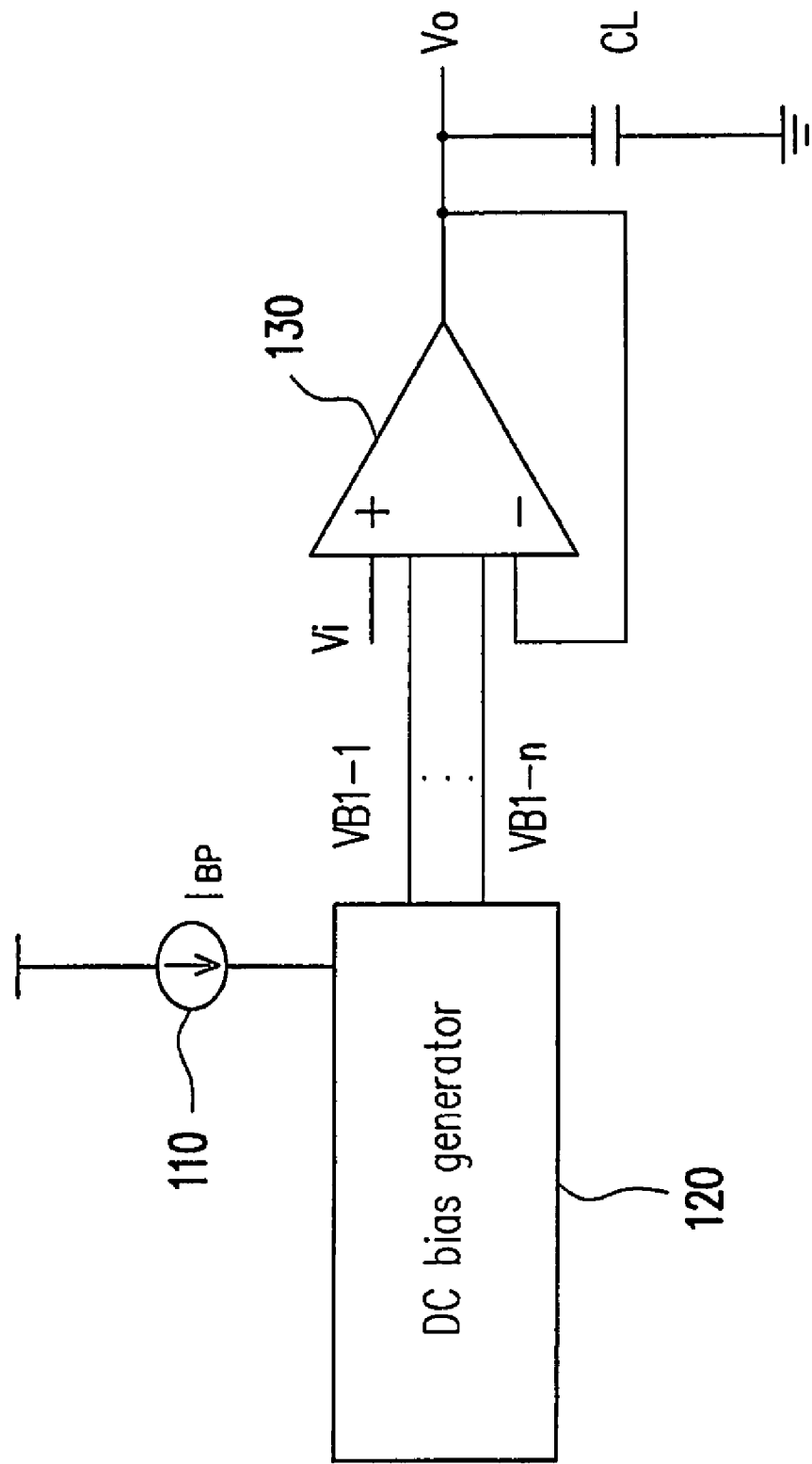
FIG. 1 is a block diagram of a conventional amplifier.
Figure 2:
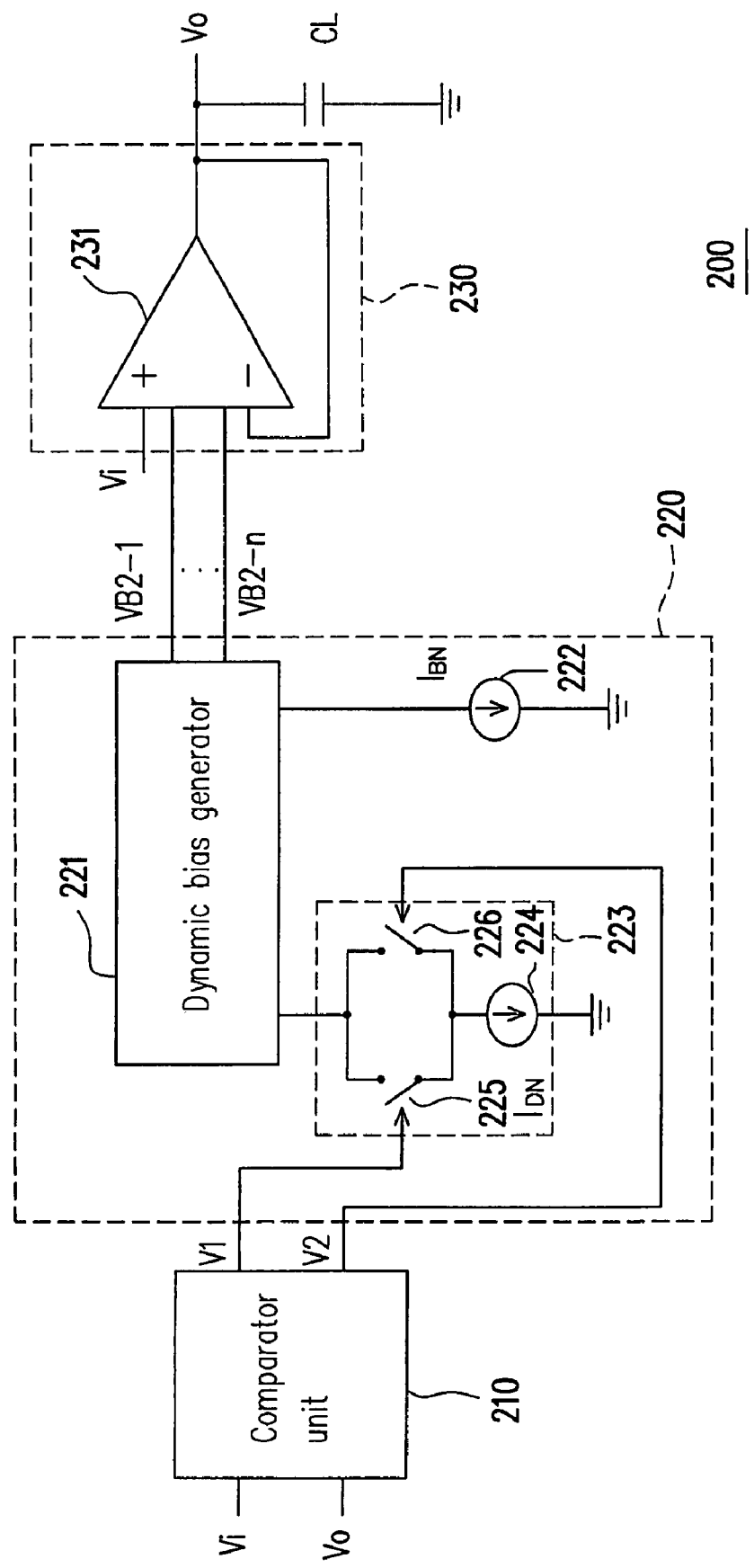
FIG. 2 shows a dynamic biasing amplifier according to an embodiment of the present invention.

FIG. 2 shows a dynamic biasing amplifier apparatus according to an embodiment of the present invention. Referring to FIG. 2, the amplifier apparatus 200 includes a dynamic biasing apparatus and an amplifier unit 230. The dynamic biasing apparatus includes a comparator unit 210 and a dynamic bias generator unit 220. The amplifier unit 230 receives an input signal Vi and output an output signal Vo based on at least a bias voltage (bias voltages VB2-1~VB2-n in this embodiment), so as to drive a load (indicated by a load capacitor CL).

The amplifier unit 230 of the present invention can be implemented in other manners. The example as shown in FIG. 2 uses an operational amplifier 231 as the amplifier unit 230. The operational amplifier 231 receives the bias voltages VB2-1~VB2-n thereof, so as to determine the bias point of the internal circuit operation. A negative input terminal of the operational amplifier 231 is coupled to the output terminal. A positive input terminal of the operational amplifier 231 receives the input signal Vi, and an output terminal outputs the output signal Vo to the capacitor load CL.

The comparator unit 210 receives and compares the input signal Vi and the output signal Vo of the amplifier unit 230, and outputs a first signal V1 and a second signal V2 to indicate the comparing result. If the comparator unit 210 determines that the voltage of the input signal Vi is approximate to that of the output signal Vo, the signals V1 and V2 are disabled. The description that "the input signal Vi is approximate to that of the output signal Vo" is not limited to "the input signal Vi is equal to the output signal Vo." The detailed description can be obtained with reference to FIG. 3 and the following illustrations.

Figure 3:
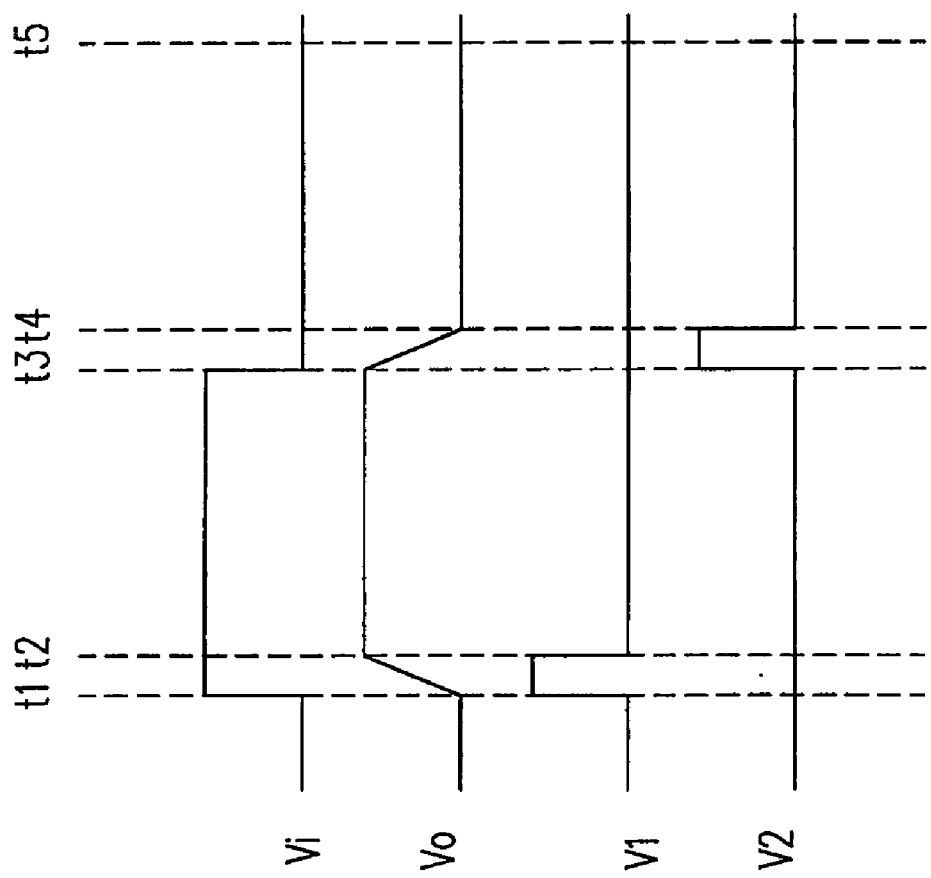
FIG. 3 is a signal timing diagram of an amplifier apparatus in FIG. 2 according to an embodiment of the present invention.

FIG. 3 is a signal timing diagram of an amplifier apparatus 200 in FIG. 2 according to an embodiment of the present invention. When the input signal Vi transits from a low level to a high level at a time t1, the output voltage is settled to a high level until t2. As the input signal Vi remains in steady state between time t2 to t3, the output signal Vo still remains in steady state. If the amplifier 230 is configured as an unity gain amplifier, it is desired that the voltage of the input signal Vi in a time interval of t2 to t3 is equal to the voltage of the output signal Vo (a slight error is allowed in practice). If the voltage gain of the amplifier unit 230 is not equal to 1, the voltage of the signal Vo is in a predetermined proportion to that of the signal Vi in the time interval of t2 to t3. Even though the input signal Vi transits at time t3, which results in the output signal Vo transits at time t4 accordingly, the voltage of the signal Vo is still in the same predetermined proportion to that of the signal Vi when the signals Vi and Vo return to the steady state (for example, time t4 to t5). Therefore, as long as the proportion between the voltages of the signal Vi and the signal Vo meets the predetermined proportion of the amplifier unit 230, it conforms to the description that "the input signal Vi is approximate to the output signal Vo" in the present invention.

Referring to FIGS. 2 and 3, it is assumed in this embodiment that the amplifier 230 is configured as an unity gain amplifier. When the voltage of the input signal Vi is greater than that of the output signal Vo, which indicates that the input signal Vi is transited ahead of Vo (for example, in the time interval of t1 to t2), the amplifier unit 230 requires a large current to drive the load capacitor CL, so as to reduce the settling time. Therefore, if the comparator unit 210 determines that the voltage of the input signal Vi is greater than that of the output signal Vo, the comparator unit 210 enables the first signal Vi and disables the second signal V2.

In addition, when the voltage of the input signal Vi is smaller than that of the output signal Vo, which indicates that the input signal Vi is transited ahead of Vo (for example, in the time interval of t3 to t4), the amplifier unit 230 still requires a large current to drive the capacitor load CL, so as to reduce the settling time. If the comparator unit 210 determines that the voltage of the input signal Vi is smaller than that of the output signal Vo, the comparator unit 210 disables the first signal V1 and enables the second signal V2.

Therefore, the dynamic bias generator unit 220 can identify if the input signal Vi is in the steady state or the transition state according to the comparing result of the comparator unit 210 (i.e., enabling states of the first signal V1 and the second signal V2). The dynamic bias generator unit 220 generates the bias voltages VB2-1~VB2-n and adjusts the level of the bias voltages VB2-1~VB2-n according to the comparing result of the comparator unit 210. By determining the level of the bias voltages VB2-1~VB2-n, the dynamic bias generator unit 220 can control the operating current of the amplifier unit 230. Therefore, when the input signal Vi is in steady state, the dynamic bias generator unit 220 controls the amplifier unit 230 to operate in a low static current mode (i.e., making the current of the amplifier unit 230 to operate in a lower static current region). When the input signal Vi is in transition state, the dynamic bias generator unit 220 controls the amplifier unit 230 to operate in a high dynamic current mode (i.e., making the current of the amplifier unit 230 to operate in a higher dynamic current region).

The dynamic bias generator unit 220 in this embodiment includes a constant current source 222, a controlled current source 223, and a dynamic bias generator 221. The constant current source 222 supplies a basic current $I_{BN}$ to the dynamic bias generator 221. The controlled current source 223 determines whether or not to supply an enhanced current $I_{DN}$ to the dynamic bias generator 221 in accordance with the comparing result of the comparator unit 210. The dynamic bias generator 221 generates and adjusts the bias voltages VB2-1~VB2-n according to the current supplied by the constant current source 222 and the controlled current source 223.

The controlled current source 223 includes an enhanced current source 224 and a switch unit constituted by switches 225 and 226. The enhanced current source 224 supplies the enhanced current $I_{DN}$. The switches 225 and 226 are connected in parallel between the enhanced current source 224 and the dynamic bias generator 221. The switch unit determines whether or not to output the enhanced current $I_{DN}$ to the dynamic bias generator 221 in accordance with the comparing result of the comparator unit 210. If the controlled current source 223 does not supply the enhanced current $I_{DN}$ (i.e., the switches 225 and 226 are turned off), the dynamic bias generator 221 outputs a corresponding bias voltage according to the basic current $I_{BN}$, so as to control the amplifier unit 230 to operate in the low static current mode. If the controlled current source 223 supplies the enhanced current $I_{DN}$ (i.e., one of the switches 225 and 226 is turned on), the dynamic bias generator 221 outputs a corresponding bias voltage according to a sum of the basic current $I_{BN}$ and the enhanced current $I_{DN}$, so as to control the amplifier unit 230 to operate in the high dynamic current mode. Therefore, in the steady state, the amplifier unit 230 can operate when the operating current is very low. When the input signal Vi is not equal to the output signal Vo, the amplifier unit 230 amplifies the differential input signal and the dynamic biased generator 221 then adjusts its operating current, so as to accelerate the transition speed of the amplifier unit 230.

Figure 4:
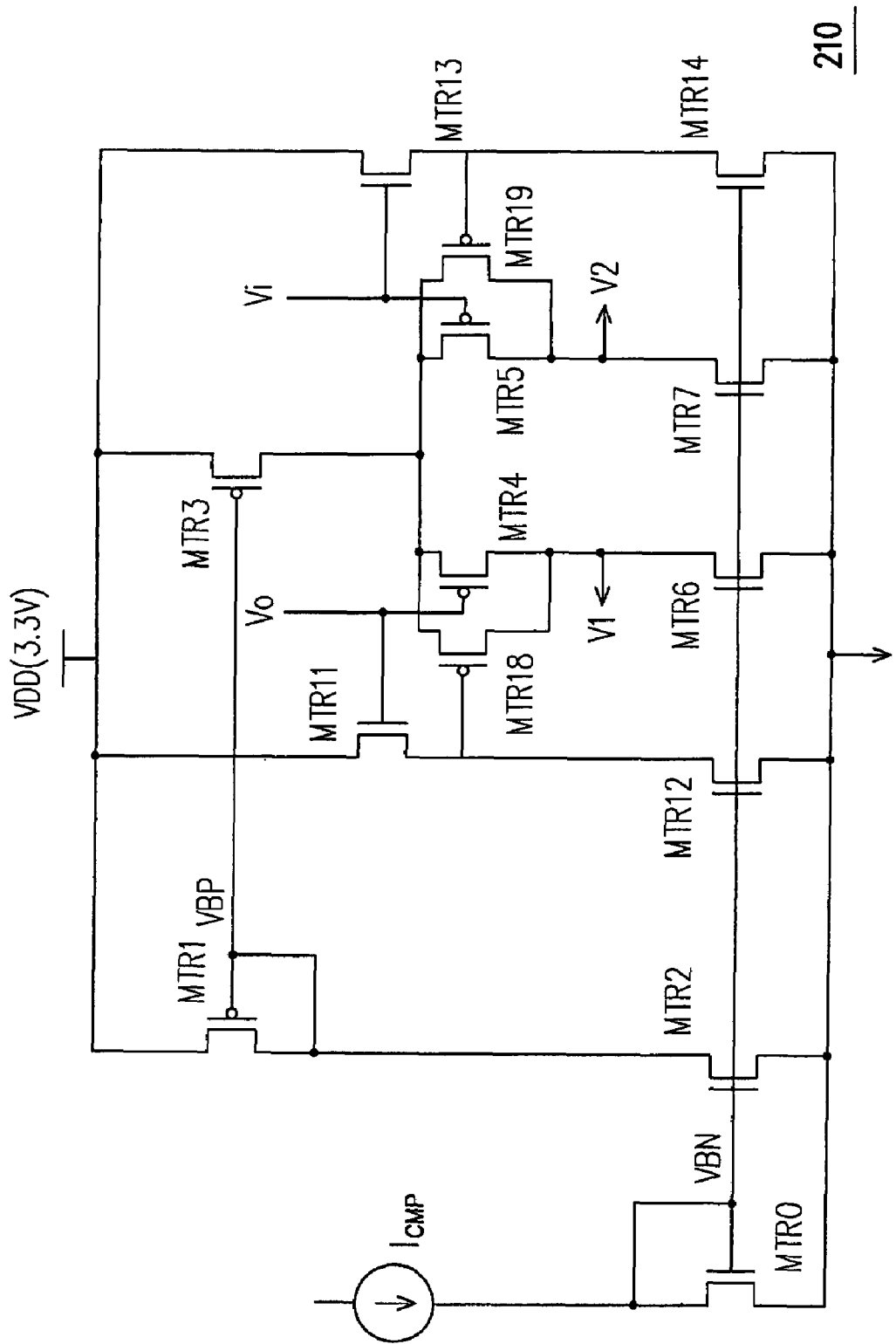
FIG. 4 is a circuit diagram of a comparator unit in FIG. 2 according to an embodiment of the present invention.

FIG. 4 is a circuit diagram of a comparator unit 210 in FIG. 2 according to an embodiment of the present invention. The comparator unit 210 includes NMOS transistors MTR0, MTR2, MTR12, MTR6, MTR7, MTR11, MTR13, and MTR14, and PMOS transistors MTR1, MTR3, MTR4, MTR5, MTR18, MTR19. The NMOS transistors MTR0, MTR2, MTR12, MTR6, MTR7, MTR14 form a current mirror. The PMOS transistors MTR1 and MTR3 form another current mirror. The transistors MTR4, MTR5 form a differential pair for receiving the input signal Vi and the output signal Vo of the amplifier unit 230. V1 and V2 are the comparing result of the comparator unit 210.

Figure 5:
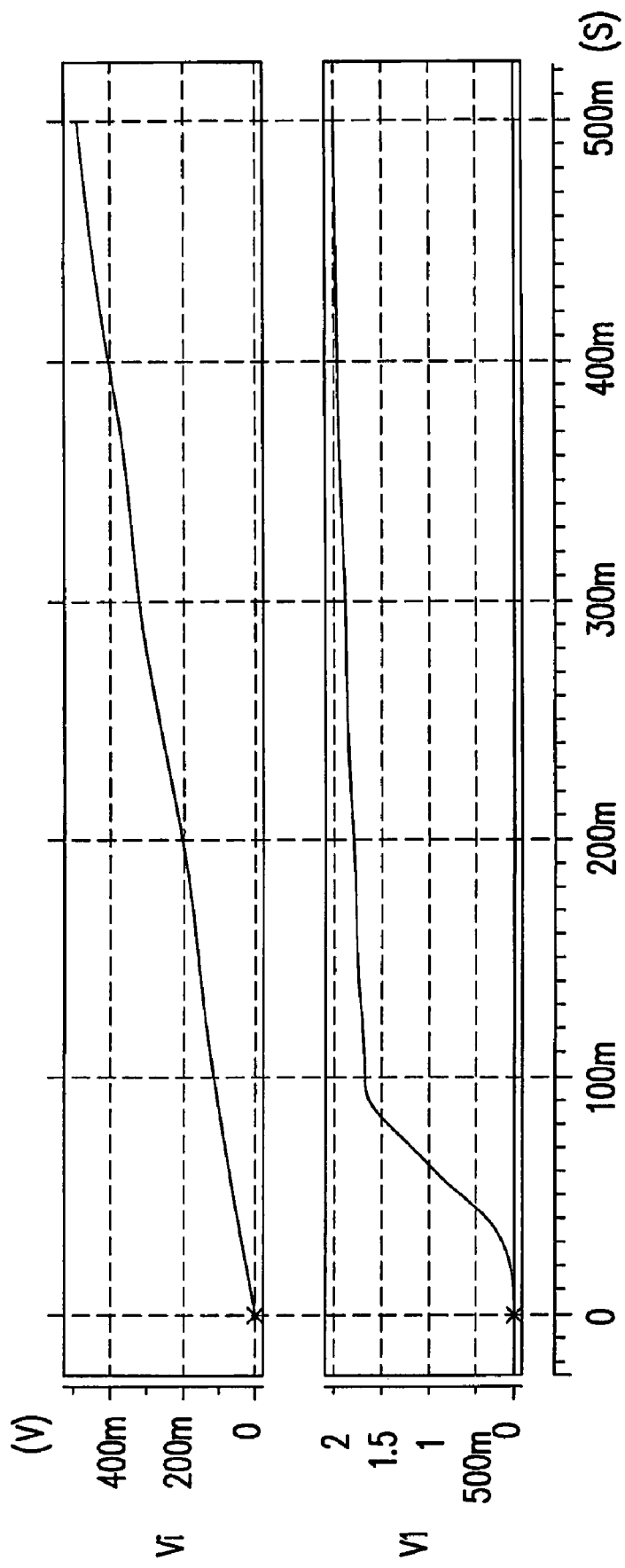
FIG. 5 shows a simulation result of the comparator unit in FIG. 4 according to an embodiment of the present invention.

FIG. 5 shows a simulation result of the comparator unit 210 in FIG. 2 according to an embodiment of the present invention. The simulation conditions include that the output signal Vo of the amplifier unit 230 is equal to 0V, and the input signal Vi of the amplifier unit 230 is changed from 0V to 0.5V. The change of the output voltage of the first signal V1 (i.e., the comparing result of the comparator unit 210) can be observed from FIG. 5. The simulation result shows that when the voltage difference between the input signal Vi and the output signal Vo is approximate to 100 mV, the first signal V1 is greatly changed.

Figure 6:
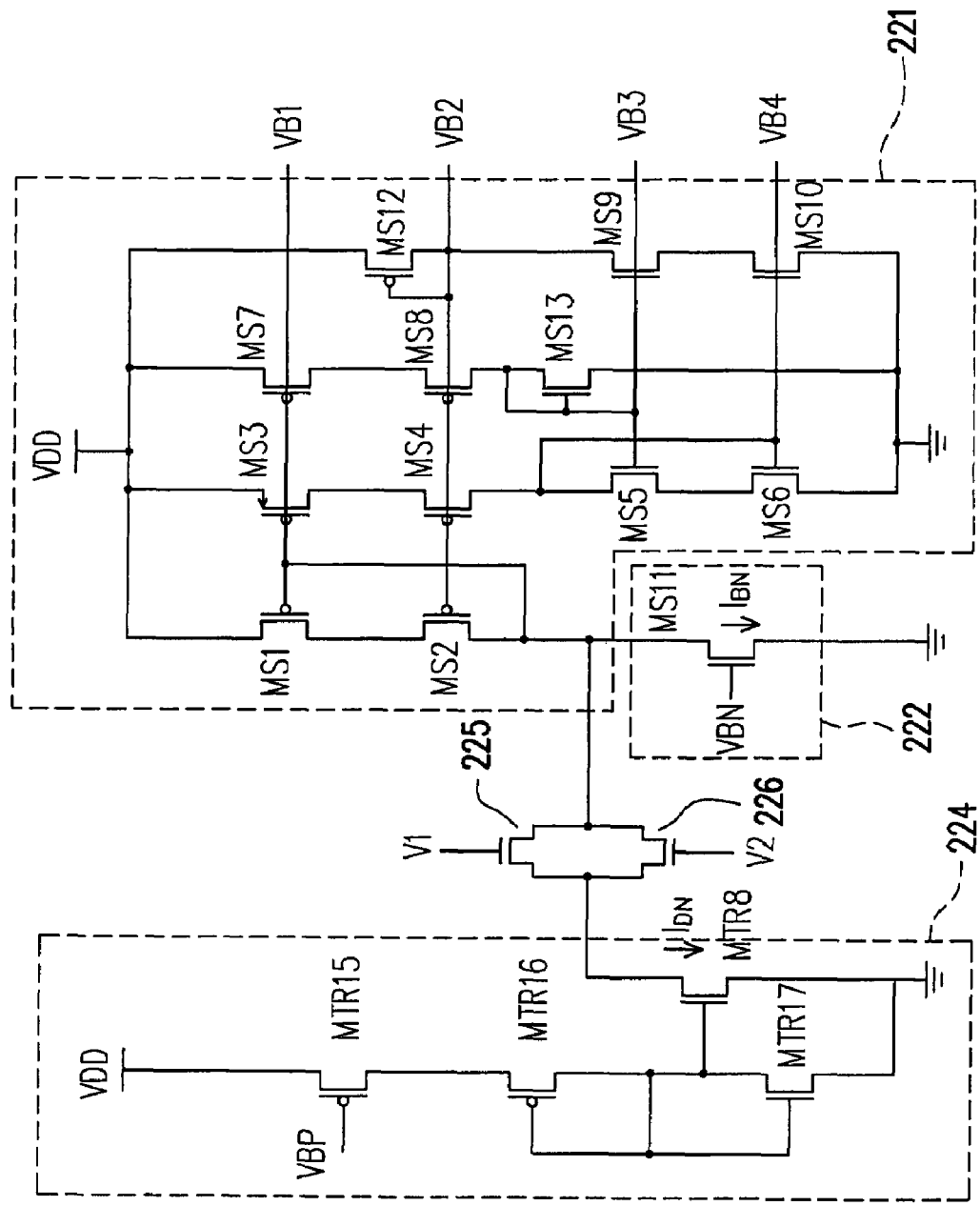
FIG. 6 is a circuit diagram of a dynamic bias generator unit in FIG. 2 according to an embodiment of the present invention.

FIG. 6 is a circuit diagram of a dynamic bias generator unit 220 in FIG. 2 according to an embodiment of the present invention. The enhanced current source 224 includes PMOS transistors MTR15 and MTR16, and NMOS transistors MTR17 and MTR8. The transistor MTR8 is a current source. The size of the transistor MTR8 or the reference voltage VBP can be adjusted according to the actual requirements, so as to achieve a desired enhanced current $I_{DN}$. The above reference voltage VBP can be a gate voltage of the transistor MTR1 of the comparator unit 210 in FIG. 4.

Herein, the NMOS transistor can be used to implement the switches 225 and 226. The signals V1 and V2 output by the comparator unit 210 are used to control the switches 225 and 226. It is determined whether or not to supply the enhanced current $I_{DN}$ to the dynamic bias generator 221 according to the states of the switches 225 and 226. The switches 225 and 226 can be implemented in other manners. For example, one MOS switch and one OR gate can be used to replace the switches 225 and 226 in FIG. 6. Both ends of the MOS switch are respectively connected to the dynamic bias generator 221 and the enhanced current source 224. The OR gate receives the signals V1 and V2, and the output of the OR gate is used to control the MOS switch, so as to determine whether or not to supply the enhanced current $I_{DN}$ to the dynamic bias generator 221.

The constant current source 222 can be implemented by the NMOS transistor MS11. The size of the transistor MS11 or the reference voltage VBN can be adjusted according to the actual requirements, so as to achieve the desired basic current $I_{BN}$. The reference voltage VBN can be the gate voltage of the transistor MTR0 in the comparator unit 210 of FIG. 4.

The dynamic bias generator 221 includes PMOS transistors MS1, MS2, MS3, MS4, MS7, MS8 and MS12, and NMOS transistors MS5, MS6, MS9, MS10 and MS13. When the switches 225 and 226 are turned off, the dynamic bias generator 221 operates in the low static current mode (only the basic current $I_{BN}$). When the switch 225 or 226 is turned on, the dynamic bias generator 221 operates in the high dynamic current mode (the sum of the basic current $I_{BN}$ and the enhanced current $I_{DN}$). Therefore, the dynamic bias generator 221 generates the bias voltage (only the bias voltages VB1, VB2, VB3 and VB4 are taken as examples herein) to the amplifier unit 230 according to the above operating current.

Therefore, the amplifier apparatus 200 is very suitable for a system requiring low power consumption. The amplifier apparatus 200 changes the bias point in accordance with the comparing result of the input and output signals. In the steady state, the amplifier apparatus is controlled to operate in the low static current mode, so that the power dissipation can be minimized. When the input signal is in transition state (i.e., when the level of the input voltage Vi and that of the output voltage Vo of the amplifier unit 230 are different), the dynamic bias generator 221 supplies a larger operating current to the amplifier unit 230, i.e., making the amplifier apparatus 200 to operate in the high dynamic current mode. Particularly, when the amplifier apparatus 200 is used to drive a larger capacitive load CL, the present invention enhances the slew rate of the amplifier apparatus greatly without increasing the static current consumption.

Figure 7:
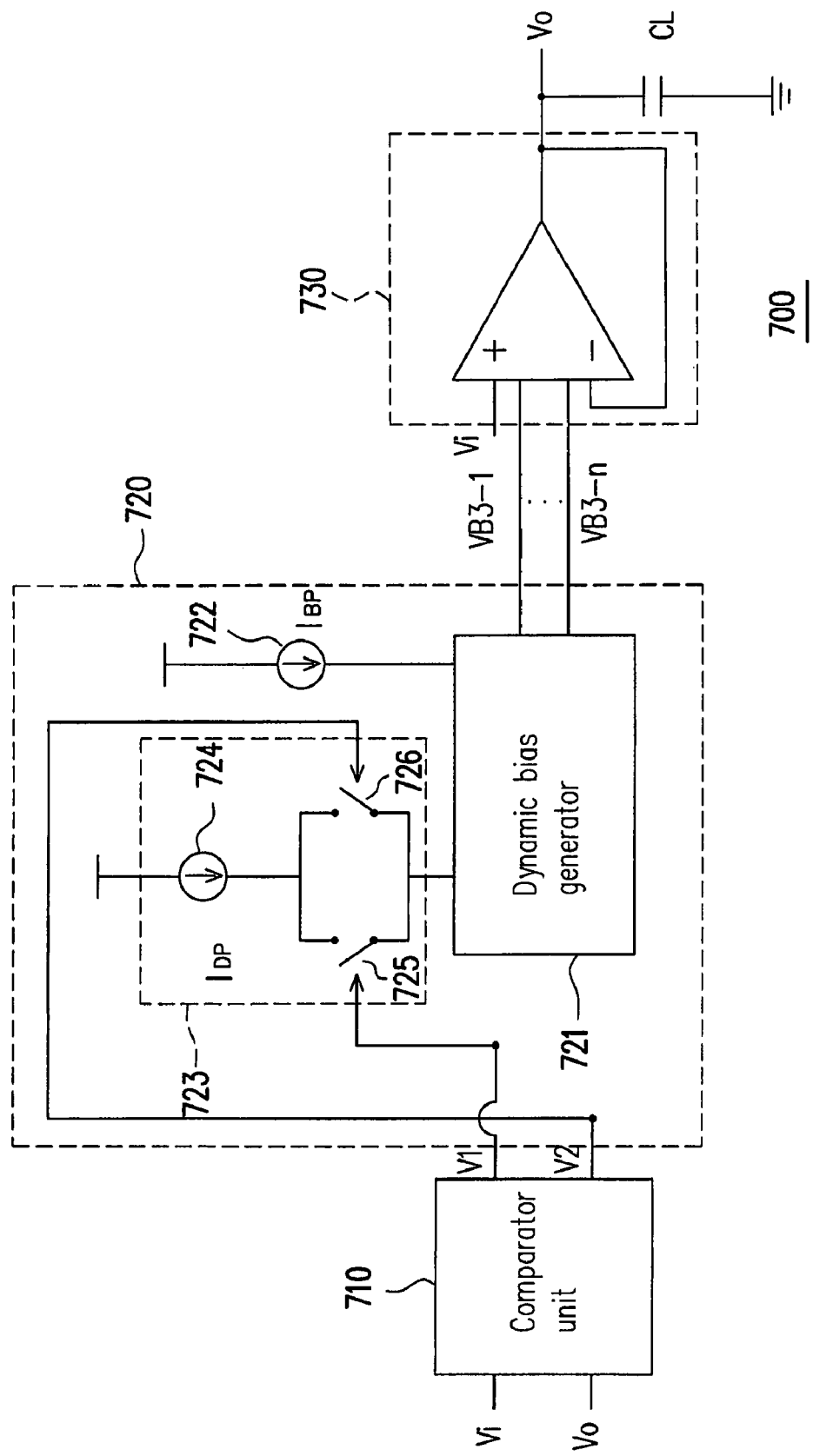
FIG. 7 is a block diagram of a dynamic biasing amplifier apparatus according to another embodiment of the present invention.

The implementation of the present invention is not limited to the above embodiments. Those of ordinary skill in the art can implement the present invention in other manners as required according to the teaching of the above embodiments. For example, FIG. 7 is a block diagram of a dynamic biasing amplifier apparatus according to another embodiment of the present invention. Referring to FIG. 7, the amplifier apparatus 700 includes a dynamic biasing apparatus and an amplifier unit 730. The dynamic biasing apparatus includes a comparator unit 710 and a dynamic bias generator unit 720. The amplifier unit 730 receives the input signal Vi and output the output signal Vo based on at least a bias voltage (the bias voltages VB3-1~VB3-n in this embodiment), so as to drive the load (for example, the load capacitor CL).

The comparator unit 710 and the amplifier unit 730 can be implemented in other manners. For example, the comparator unit 710 and the amplifier unit 730 can be implemented with reference to the comparator unit 210 and the amplifier unit 230 in the above embodiment, and the details will not be described herein again.

The dynamic bias generator unit 720 in this embodiment includes a constant current source 722, a controlled current source 723, and a dynamic bias generator 721. The constant current source 722 supplies a basic current $I_{BP}$ to the dynamic bias generator 721. The controlled current source 723 determines whether or not to supply an enhanced current $I_{DP}$ to the dynamic bias generator 721 in accordance with the comparing result of the comparator unit 710 (i.e., the first signal V1 and the second signal V2). The dynamic bias generator 721 generates and adjusts the bias voltages VB3-1~VB3-n according to the current supplied by the constant current source 722 and the controlled current source 723. By determining the levels of the bias voltages VB3-1~VB3-n, the dynamic bias generator unit 720 controls the operating current of the amplifier unit 730. Therefore, when the input signal Vi is in steady state, the dynamic bias generator unit 720 controls the amplifier unit 730 to operate in the low static current mode (i.e., making the current of the amplifier unit 730 to operate in the static current region). When the input signal Vi is in transition state, the dynamic bias generator unit 720 controls the amplifier unit 730 to operate in the high dynamic current mode (i.e., making the current of the amplifier unit 730 to operate in the high dynamic current region). The dynamic bias generator 721 can be implemented in other manners. For example, the dynamic bias generator 721 can be implemented with reference to the dynamic bias generator 221 in the above embodiment, and the details will not be described herein again.

In view of the above, the embodiment of a dynamic biasing method of an amplifier apparatus will be described below. The dynamic biasing method includes firstly providing an operating current, so as to generate at least a bias voltage to the amplifier apparatus according to the value of the operating current. This step further includes supplying a basic current to serve as a part of the operating current.

The amplifier apparatus receives the input signal Vi and output an output signal Vo based on the bias voltage. Next, the input signal Vi and the output signal Vo are compared, so as to obtain a comparing result. If the comparing result shows that the voltage of the input signal Vi is approximate to that of the output signal Vo, the operating current is adjusted to a small current value. For example, only the basic current is supplied to serve as the whole operating current.

If the comparing result shows that the voltage of the input signal Vi is not approximate to that of the output signal Vo, the operating current is adjusted to a large current value. For example, an enhanced current is supplied to serve as another part of the operating current (i.e., making the sum of the basic current and the enhanced current as the operating current), so as to adjust the operating current to a large current value.

Finally, the bias voltage is adjusted according to the value of the operating current. If the enhanced current is not supplied, the bias voltage is adjusted according to the basic current, so as to control the amplifier apparatus to operate in the low static current mode, when the input signal is in steady state. If the enhanced current is provided, the bias voltage is adjusted according to the sum of the basic current and the enhanced current, so as to control the amplifier apparatus to operate in the high dynamic current mode when the input signal Vi is in the transition state.

In the above embodiment, the bias point of the amplifier apparatus is changed in accordance with the comparing result of the input signal Vi and the output signal Vo. Therefore, when the input signal Vi is in steady state, the amplifier apparatus is controlled to operate in the low static current mode, so as to reduce the power consumption. When the input signal Vi is in transition state, the amplifier apparatus is controlled to operate in the high dynamic current mode. The above embodiment greatly enhances the slew rate of the amplifier apparatus without enhancing the static current consumption.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A dynamic biasing amplifier apparatus, comprising:
   an amplifier unit, for receiving and amplifying an input signal to output an output signal based on at least a bias voltage;
   a comparator unit, for comparing the input and output signals of the amplifier unit; and
   a dynamic bias generator unit, coupled between the comparator unit and the amplifier unit, for generating and adjusting the bias voltage in accordance with a comparing result of the comparator unit, so as to control the amplifier unit to operate in a low static current mode when the input signal is in a steady state, and to control the amplifier unit to operate in a high dynamic current mode when the input signal is in a transition state.

2. The dynamic biasing amplifier apparatus as claimed in claim 1, wherein the comparing result of the comparator unit comprises a first signal and a second signal; if the comparator unit determines that a voltage of the input signal is approximate to that of the output signal, the first signal and the second signal are disabled; if the comparator unit determines that the voltage of the input signal is greater than that of the output signal, the first signal is enabled and the second signal is disabled; and if the comparator unit determines that the voltage of the input signal is smaller than that of the output signal, the first signal is disabled, and the second signal is enabled.

3. The dynamic biasing amplifier apparatus as claimed in claim 1, wherein the dynamic bias generator unit comprises:
   a constant current source, for supplying a basic current;
   a controlled current source, for determining whether or not to provide an enhanced current in accordance with a comparing result of the comparator unit; and
   a dynamic bias generator, for generating and adjusting the bias voltage according to a current supplied by the constant current source and the controlled current source;
   wherein if the controlled current source does not supply the enhanced current, the dynamic bias generator outputs a corresponding bias voltage according to the basic current, so as to control the amplifier unit to operate in the low static current mode; and
   if the controlled current source supplies the enhanced current, the dynamic bias generator outputs a corresponding bias voltage according to a sum of the basic current and the enhanced current, so as to control the amplifier unit to operate in the high dynamic current mode.

4. The dynamic biasing amplifier apparatus as claimed in claim 3, wherein the controlled current source comprises:
   an enhanced current source, for supplying the enhanced current; and
   a switch unit, coupled between the enhanced current source and the dynamic bias generator, for determining whether or not to output the enhanced current to the dynamic bias generator in accordance with the comparing result of the comparator unit.

5. The dynamic biasing amplifier apparatus as claimed in claim 1, wherein the amplifier unit comprises an operational amplifier, having a bias end receiving the bias voltage, a positive input end receiving the input signal, a negative input end coupled to the output end, and an output end outputting the output signal.

6. A dynamic biasing apparatus, for providing at least a bias voltage to an amplifier unit, so as to control the amplifier unit to amplify an input signal to output an output signal, comprising:
   a comparator unit, for comparing a differential input signals; and
   a dynamic bias generator unit, coupled to the comparator unit, for generating and adjusting the bias voltage in accordance with the comparing result of the comparator unit, so as to control the amplifier unit to operate in a low static current mode when the input signal is in a steady state, and to control the amplifier unit to operate in a high dynamic current mode when the input signal is in a transition state.

7. The dynamic biasing apparatus as claimed in claim 6, wherein the comparing result of the comparator unit comprises a first signal and a second signal; if the comparator unit determines that a voltage of the positive input is approximate to that of the negative input, the first and second signals are disabled; if the comparator unit determines that the voltage of the positive input is greater than that of the negative input, the first signal is enabled and the second signal is disabled; and if the comparator unit determines that the voltage of the positive input is smaller than that of the negative input, the first signal is disabled and the second signal is enabled.

8. The dynamic biasing apparatus as claimed in claim 6, wherein the dynamic bias generator unit comprises:
   a constant current source, for supplying a basic current;
   a controlled current source, for determining whether or not to supply an enhanced current in accordance with the comparing result of the comparator unit; and
   a dynamic bias generator, for generating and adjusting the bias voltage according to a current supplied by the constant current source and the controlled current source;
   wherein if the controlled current source does not supply the enhanced current, the dynamic bias generator outputs a corresponding bias voltage according to the basic current, so as to control the amplifier unit to operate in the low static current mode; and
   if the controlled current source supplies the enhanced current, the dynamic bias generator outputs a corresponding bias voltage according to a sum of the basic current and the enhanced current, so as to control the amplifier unit to operate in the high dynamic current mode.

9. The dynamic biasing apparatus as claimed in claim 8, wherein the controlled current source comprises:
   an enhanced current source, for supplying the enhanced current; and
   a switch unit, coupled between the enhanced current source and the dynamic bias generator, for determining whether or not to output the enhanced current to the dynamic bias generator in accordance with the comparing result of the comparator unit.

10. A dynamic biasing method of an amplifier apparatus, wherein the amplifier apparatus receives an input signal and output an output signal based on at least a bias voltage, comprising:
    providing an operating current;
    comparing the input and output signals to obtain a comparing result;
    if the comparing result shows that a voltage of the input signal is approximate to that of the output signal, adjusting the operating current to a small current value;
    if the comparing result shows that the voltage of the input signal is not approximate to that of the output signal, adjusting the operating current to a large current value; and
    wherein the bias voltage is adjusted according to the value of the operating current, so as to control the amplifier apparatus to operate in a low static current mode when the input signal is in a steady state, and to control the amplifier apparatus to operate in a high dynamic current mode when the input signal is in a transition state.

11. The dynamic biasing method of an amplifier apparatus as claimed in claim 10, wherein the step of providing the operating current comprises:
    providing a basic current as a part of the operating current.

12. The dynamic biasing method of an amplifier apparatus as claimed in claim 11, wherein if the comparing result shows that the voltage of the input signal is not approximate to that of the output signal, an enhanced current is provided to serve as another part of the operating current, so as to adjust the operating current as a large current value.

13. The dynamic biasing method of an amplifier apparatus as claimed in claim 12, wherein if the enhanced current is not provided, the bias voltage is adjusted according to the basic current, so as to control the amplifier apparatus to operate in the low static current mode; and
    if the enhanced current is provided, the bias voltage is adjusted according to a sum of the basic current and the enhanced current, so as to control the amplifier apparatus to operate in the high dynamic current mode.

* * * * *